(12) United States Patent
Krijn

(10) Patent No.: US 6,236,052 B1
(45) Date of Patent: May 22, 2001

(54) QUADRUPOLE DEVICE FOR PROJECTION LITHOGRAPHY BY MEANS OF CHARGED PARTICLES

(75) Inventor: Marcellinus P. C. M. Krijn, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/392,686

(22) Filed: Sep. 9, 1999

(30) Foreign Application Priority Data

Sep. 9, 1998 (EP) .................................................. 98203014

(51) Int. Cl.$^7$ ................................................. H01J 37/153
(52) U.S. Cl. ............................ 250/396 ML; 250/396 R; 250/492.2; 313/361.1
(58) Field of Search ...................... 250/396 ML, 396 R, 250/492.2; 313/361.1

(56) References Cited

U.S. PATENT DOCUMENTS 4,823,013 * 4/1989 Van Der Mast .............. 250/396 ML
5,298,757 * 3/1994 Okayama ........................ 250/396 R

* cited by examiner

Primary Examiner—Jack Berman
Assistant Examiner—Nikita Wells
(74) Attorney, Agent, or Firm—Steven R. Biren

(57) ABSTRACT

According to a known projection lithography method an object is imaged on an imaging surface by means of a telescopic system of rotationally symmetrical electron lenses. The throughput during the production of integrated circuits by means of projection lithography is determined by the amount of current in the imaging electron beam; this current is limited by the resolution-limiting interaction of the electrons (Coulomb interaction). The invention allows for a larger beam current in that areas with a high current concentration are avoided. To this end, the imaging system includes five mutually perpendicular quadrupoles, so that the electrons are concentrated in line-shaped focal spots instead of a (small) circular cross-over (18). The system is telescopic and the imaging is stigmatic with equal magnifications in the x-z plane and the y-z plane.

3 Claims, 2 Drawing Sheets

QUADRUPOLE DEVICE FOR PROJECTION LITHOGRAPHY BY MEANS OF CHARGED PARTICLES

BACKGROUND OF THE INVENTION

The invention relates to a lithography device for carrying out projection lithography by means of charged particles, which device includes an imaging particle-optical system for imaging a lithographic object structure on a lithographic imaging surface.

A device of this kind is known from an article in Proceedings SPIE "Electron-Beam Sources and Charged-Particle Optics", Jul. 10–14, 1995 by W. K. Waskiewicz et al., entitled "Electron-Optical Design for the SCALPEL Proof-of-Concept Tool", published in SPIE, Vol. 2522, 1995.

SUMMARY OF THE INVENTION

Particle-optical imaging, notably electron optical imaging, can be used for the lithographic manufacture of very small structures, such as integrated electronic circuits or masks for such circuits, with a resolution which is less than the wavelength of light.

The imaging of a lithographic object structure on a lithographic imaging surface by means of electrons can in principle be carried out in two ways: sequentially and non-sequentially. In the case of sequential imaging, the emissive surface of an electron source, or a part thereof, is imaged, at a strongly reduced scale, on the lithographic imaging surface on which the lithographic structure to be formed is to be provided. This image of the electron source (the "spot") is displaced across the object by means of, for example deflection coils, the electron beam being blanked or not during said displacement. The pixels of the pattern to be imaged are thus sequentially written onto the lithographic imaging surface. As the dimensions of the lithographic structure are larger, significantly more time will be required for the scanning writing of this structure, i.e. an increase in time in proportion to the surface area of the structure. Because nowadays in the integrated circuit technique there is a strong tendency to image increasingly larger structures, the throughput during the production of integrated circuits decreases strongly, so that this method of imaging is becoming increasingly more objectionable.

In the case of non-sequential imaging, the lithographic object structure to be imaged is uniformly irradiated by means of the electron beam and a focusing lens system is used to form an image, reduced or not, of the lithographic object structure on the lithographic imaging surface. The pixels of the pattern to be imaged are thus simultaneously, i.e. not sequentially, projected onto the lithographic imaging surface. Therefore, this method of lithography is also called projection lithography.

The cited article describes a projection lithography method in which a lithographic object structure is imaged on a lithographic imaging surface by means of a system of rotationally symmetrical electron lenses. Such a lithographic object structure can be formed by a (comparatively large) rendition of a lithographic mask which is to be imaged on a lithographic imaging surface in order to derive the actual (much smaller) lithographic mask therefrom. The lithographic object structure to be imaged may also be formed by the actual mask, which is then imaged on the lithographic imaging surface (in that case being a wafer) in order to form integrated circuits therefrom. This known lithographic method is called SCALPELS® ("Scattering with Angular Limitation Projection Electron-beam Lithography"). The imaging system of electron lenses therein is formed by two electron lenses, having a rotationally symmetrical lens field, which together constitute a telescopic system.

In the context of the present invention a telescopic system is to be understood to mean a system of lenses which converts an incident parallel beam into a parallel outgoing beam. The simplest form of such a system consists of two lenses having a common optical axis, the rear focus of one lens being coincident with the front focus of the other lens, as is the case in the cited state-of-the-art system. Projection lithography requires a telescopic system, because a comparatively large lithographic object structure (having a diameter of the order of magnitude of 1 mm) must be completely imaged on the lithographic imaging surface. The edges of said structure should in principle be just as sharp as its center, which means that the imaging defects at the edges of the structure to be imaged may hardly be greater than those at the central parts. This condition can be optimally satisfied only if the imaging system is a telescopic system, so that for the present invention it is of essential importance to perform the imaging by means of such a system.

During the production of integrated circuits by means of projection lithography the throughput is determined by the magnitude of the current in the electron beam whereby the lithographic object structure to be imaged (so the mask to be imaged in the case of IC manufacture) is irradiated. A limit is imposed as regards the current in the electron beam because the electrons in the beam repel one another (the so-called-Coulomb interaction), causing an energy spread of the electrons in the beam and distortion of the beam. Both effects are greater as the current in the electron beam is larger, and cause imaging defects by the imaging system. The imaging defects may not exceed a specified value, so that an upper limit is also imposed as regards the current in the beam, and hence also as regards the throughput of the integrated circuits to be produced.

The described repulsion effect is strongest in the part of the electron beam where the spacing of the electrons in the beam is small, i.e. at the area of a cross-over in the electron beam. In the cited state-of-the-art system such a cross-over occurs between said two round lenses which together constitute the telescopic system, that is to say at the area of the coincident focal points of the two lenses. Even though it may occur that cross-overs are also formed in the electron beam ahead of the telescopic system, such cross-overs do not have an effect on the (geometrical) imaging defects, because they are situated in the irradiating part of the beam and do not occur in the imaging beam path between the object (the lithographic object structure) and the image (the lithographic imaging surface).

OBJECTS AND SUMMARY OF THE INVENTION

It is an object of the invention to make said limitation of the current in the electron beam less severe, and hence increase the throughput during the production of integrated circuits.

To the end, the lithography device according to the invention is characterized in that the particle-optical system includes at least five quadrupoles, neighboring quadrupoles of said quadrupoles each time extending perpendicularly to one another, the strength and the location of said quadrupoles being such that the imaging of the lithographic object structure on the lithographic imaging surface is stigmatic, and that the system is telescopic in the x-z plane as well as in the y-z plane.

As is known from particle optics, a quadrupole field exerts a pure converging effect on a beam of charged particles in a first plane containing the optical axis (the converging plane) whereas it has a purely diverging effect in a plane which extends perpendicularly thereto and contains the optical axis (the diverging plane). In the context of tile present invention mutually perpendicularly extending quadrupoles are to be understood as a system of quadrupoles in which the converging (diverging) plane of one quadrupole extends perpendicularly to the converging (diverging) plane of another quadrupole.

The invention is based on the recognition of the fact that it is in principle possible to form a stigmatic image by means of more than one quadrupole. Realizing this image by means of a system which is telescopic in the x-z plane as well as in the y-z plane enables the desired high resolution to be achieved at the edges of the image.

Furthermore, the use of quadrupoles offers the additional advantage that, in comparison with round lenses, only little power is dissipated in the windings of the field-generating pole pieces. This is due to well known particle optical fact that a strong lens effect can be achieved for quadrupoles while utilizing a comparatively small number of ampere-turns, so a low power dissipation. Therefore, these windings cause only a slight temperature increase so that mechanical deformations due to thermal expansion remain limited.

It is to be noted that from Japanese patent application 5-286948, published on Jun. 2, 1995 (filed on Nov. 16, 1993, publication No. 7-142318), it is known per se to counteract the Coulomb interaction in an electron beam traversing a lens system by distorting a cross-over by means of quadrupoles which are arranged at the area of the cross-over in order to form a beam structure having an enlarged beam cross-section. The imaging systems known from the cited document, however, are intended to form a spot shape for a sequential imaging application (so the scanning exposure of the lithographic imaging surface). Such known systems include rotationally symmetrical lenses as well as quadrupoles. According to the method described in the cited document the desired spot shape is obtained by imaging a beam-limiting gap onto a second beam-limiting gap and by imaging this assembly in its turn on a lithographic imaging surface. It will be evident that this is not a matter of projection lithography and, therefore, the cited document does not offer any hints as to which steps are required so as to perform projection lithography by means of exclusively quadrupoles which, moreover, also constitute a telescopic system.

When the above-mentioned steps according to the invention are taken, it is also achieved that the image is rotation free, i.e. that the image on the lithographic imaging surface has not been rotated relative to the lithographic object structure, regardless of the excitation of the quadrupoles. This substantially simplifies the alignment of the equipment to be used.

DESCRIPTION OF THE PREFERRED EMBODIMENTS

In a preferred embodiment of the lithography device according to the invention, the x magnification from the lithographic object structure to the lithographic imaging surface equals the y magnification. Generally speaking, when quadrupoles are used for a stigmatic image, the magnification in the x direction deviates from that in the y direction. In such cases additional steps would be required so as to compensate for the distortion thus caused, for example by a prior distortion of the object to be imaged. As a result of said steps, a non-distorted image is obtained so that such additional steps can be dispensed with.

In a further preferred embodiment of the lithography device according to the invention, the various parameters of the imaging particle-optical system have the values stated in claim 3.

BRIEF DESCRIPTION OF THE DRAWINGS

The invention will be described in detail hereinafter with reference to the Figures in corresponding reference numerals denote corresponding elements. Therein:

FIG. 1 is a diagrammatic representation of a state of the art imaging particle-optical system for imaging a lithographic object structure on a lithographic imaging surface. In this Figure an electron beam is produced by an electron source 2. The electron beam travels through the lens system along an optical axis 4. The system shown also consists of two round (i.e. rotationally symmetrical) lenses 8 and 10, whose axes coincide with the optical axis of the system. Both lenses 10 and 12 image a lithographic object structure 14 to be imaged, for example a lithographic mask, on a lithographic imaging surface 16, for example a wafer on which integrated circuits are to be formed. In the system shown, the focal length $f_1$ of the lens 10 equals 160 mm, like the distance $d_2$ from the mask 14 to the lens 10. The focal length $f_2$ of the lens 12 equals 40 mm, like the distance $d_2$ from the lens 12 and the surface of the wafer 16 to be irradiated. It appears from these numbers that the mask is imaged on the wafer with a reduction factor amounting to 160.40=4:1. When the ratio of the diameter of the bore to the gap (bore to gap ratio) of the two lenses is chosen to be equal and the excitation of these lenses is equal but opposed, this system will cause hardly any or no image rotation.

Figure 1:
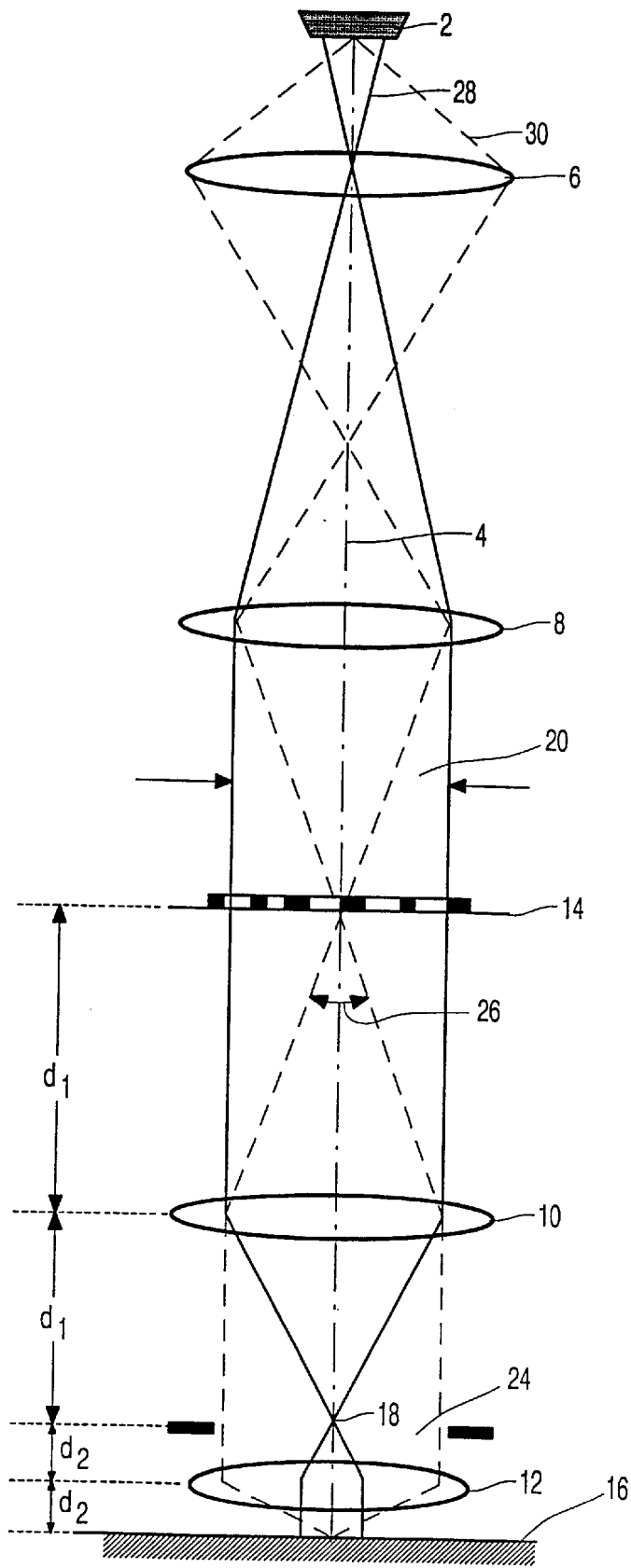
FIG. 1 is a diagrammatic representation of an imaging particle-optical system for the imaging of a lithographic object structure on a lithographic imaging surface according to the present state of the art.

The mask 14 to be imaged on the surface of the wafer 16 is irradiated by means of two condensor lenses 6 and 8 which form a more or less parallel beam of a width of approximately 1 mm at the area of the beam cross-section 20, that is to say at the area of the mask 14. This Figure also shows a round beam-limiting diaphragm 24 which has a diameter of 160 μm at the area of the coincident focal points of the lenses 10 and 12. From the stated values of the focal length $f_1$ of the lens 10 and the diameter of die diaphragm 24 it also follows that the angle of aperture 26 of the electron beam equals 1 mrad.

FIG. 1 shows two beam paths: the beam path of the irradiating beam 28 (shown in solid lines) and that of the imaging beam 30 (shown in dashed lines). Even though the irradiating beam and the imaging beam are not separate beams but form part of the beam of electrons emanating from the source 2, a distinction is made between the two imaginary beams 28 and 30 so as to elucidate the different functions (irradiation and imaging). The rays of the irradiating beam 28 are incident in parallel on the mask 14 via the condensor system 6, 8. The parallel rays are focused, via the lens 10, in the common focal plane of this lens and the lens 12, after which they emanate in parallel again from the lens 12 so as to travel in the direction of the imaging surface 16. Via the condenser system 6, 8, the rays of the imaging beam 30 are incident on the mask 14 in a non-parallel manner. Consequently, the mask 14 is imaged in infinity by the lens 10, i.e. the rays emanating from a given point of the mask 14 emanate from the lens 10 as a parallel beam. The lens 12 focuses this parallel beam on the imaging surface 16 which coincides with the rear focus of the lens 12. The mask 14 irradiated by the beam 28 is thus imaged on the imaging surface 16.

Between the two lenses 10 and 12, together constituting the telescopic system, a cross-over 18 is formed at the area of the coincident focal points of the two lenses. Thus, the highest spatial concentration of electrons between the two lenses 10 and 12 occurs at this point in the beam path, so within the aperture of the round beam-limiting diaphragm 24 which has a diameter of 160 μm. The dimension of the diaphragm 24 is determined by the required angle of aperture of the imaging beam, which angle of aperture itself is imposed by the permissible imaging defects, so by the desired resolution of the image.

Figure 2:
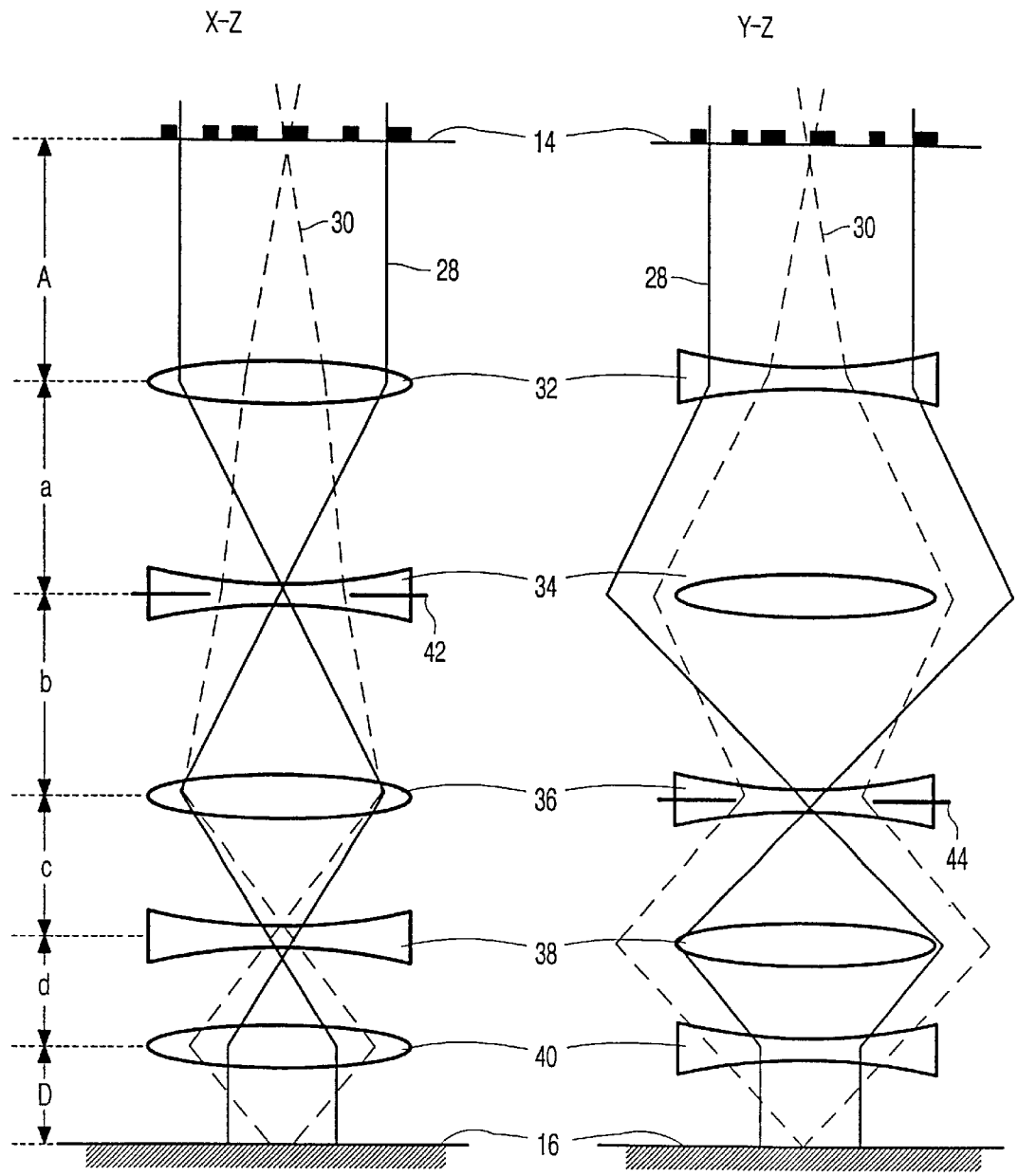
FIG. 2 is a diagrammatic representation of an imaging particle-optical system which is provided with five quadrupoles according to the invention.

FIG. 2 is a diagrammatic representation of an imaging particle-optical system which includes five quadrupoles 32, 34, 36, 38 and 40 according to the invention. This Figure shows the beam path through the system for the x-z plane as well as for the y-z plane, the beam path of the irradiating beam 28 being represented by solid lines and that of the imaging beam 30 by dashed lines as in FIG. 1. A comparison of the beam path in the x-z plane to that in the y-z plane reveals that wherever the imaging line 28 forms a focal line in the x-z plane (like in the quadrupoles 34 and 38), this beam does not form a focal line in the y-z plane, and vice versa. This means that instead of cross-overs with a strongly concentrated space charge, like the cross-over 18 in FIG. 1, spatially separated focal lines with a much lower space charge concentration are formed.

The physical dimensions of the system shown in FIG. 2 are defined by six dimensional parameters A, a, b, c, d and D) which have the following meaning:

A=the distance between the mask 14 and the first quadrupole 32, a=the distance between the first quadrupole 32 and the second quadrupole 34, b=the distance between the second quadrupole 34 and the third quadrupole 36, c=the distance between the third quadrupole 36 and the fourth quadrupole 38, d=the distance between the fourth quadrupole 38 and the fifth quadrupole 40, D=the distance between the fifth quadrupole 40 and the imaging surface 16.

It is assumed that the angular magnification by the system from the mask 14 to the imaging surface 16 equals M. Furthermore, it is also a prerequisite that the system is telescopic. When two of said five imaging parameters of such a system are specified (for example, b and D), the value of the remaining three parameters can be determined. A system is telescopic if it complies with the transfer matrix T:

$$T = \begin{pmatrix} \frac{1}{M} & 0 \\ 0 & M \end{pmatrix} \quad (1)$$

It can now be demonstrated that the above requirements can be satisfied by way of the following relations (2)–(5):

$$A = \frac{-2DM^2(1+M) + b(1+4M+M^2-C)}{2(1+M)} \quad (2)$$

$$a = b\frac{-2M+C}{2(1+M)} \quad (3)$$

$$c = \frac{b}{M} \quad (4)$$

$$d = b\frac{-2M+C}{2M^2(1+M)} \quad (5)$$

In these expressions $C=\sqrt{(M+6M^2+M^3)}$. For the associated lens excitations it holds that $q_1=a$ (see expression (3); $q_1$, is therefore, a focal length), $q_5=d$ (see expression (5)), whereas for $q_2-q_4$ it holds that:

$$q_2 = \frac{2ab}{a+b} = b\frac{-2M+C}{1-M+C} \quad (6)$$

$$q_3 = \frac{bc}{b+c} = \frac{b}{1+M} \quad (7)$$

$$q_4 = \frac{2cd}{c+d} = b\frac{-2M+C}{M(M^2-M+C)} \quad (8)$$

By way of example it is assumed that the angular magnification M=4, that the distance b between the second quadrupole 34 and the third quadrupole 36 equals 200 mm, and that the distance D between the fifth quadrupole 40 and the imaging surface 16 equals 20 mm. Using these values, the values for the various parameters are as stated in the following Table 1:

TABLE 1

|  | Quantity | Value |
|---|---|---|
| Given | M | 4 |
|  | b | 200 mm |
|  | D | 20 mm |
| Result | A | 83.88 mm |
|  | a | 96.13 mm |
|  | c | 50.00 mm |
|  | d | 6.008 mm |
|  | L | 456.0 mm |
|  | $M_x$ | −4 |
|  | $M_y$ | 4 |
|  | $q_1$ | 96.13 mm |
|  | $q_2$ | 98.02 mm |
|  | $q_3$ | 40.00 mm |
|  | $q_4$ | 9.688 mm |
|  | $q_5$ | 6.008 mm |

Even though the beam 28 in FIG. 2 is shown as a parallel beam in the zone between the mask 14 and the quadrupole 32, this beam in reality exhibits some angular spread which amounts to 1 mrad in a practical situation. This would lead to a dimension of 160 μm for the cross-over 18 in FIG. 1. In FIG. 2 this means that the width of the focal line at the center of the quadrupole 34 equals this angular spread times the distance a, so approximately 96 μm. The quadrupole 34 is provided with a beam-limiting gap 42 whose longitudinal direction extends perpendicularly to the plane of drawing. The main function of this gap is the interception of electrons which have been scattered in the optical path over these gaps, so that they would miss the actual focal line and reduce the resolution because of their imaging defects. A focal line is also formed perpendicularly to the x-z plane, that is to say at the center of the quadrupole 44. The width of this focal line is determined by the strength of the quadrupoles 32 and 34 and the values of the distances a and b. It will be evident that the (virtual) image, having a width of 96 µm, formed in the y-z plane by the quadrupole 32 is imaged in the quadrupole 36 with a linear magnification amounting to b/2a; the width of the latter image thus appears to be approximately 100 µm. The quadrupole 36 is provided with a beam-limiting gap 44 whose longitudinal direction extends perpendicularly to the plane of drawing. The function of this gap is the same as that of the gap 42. The width of these two gaps, therefore, can be chosen to be equal to the width of the two focal lines. Using the above-mentioned numbers, it will be evident that the length of the two focal lines amounts to approximately 2 mm in the case of an incident beam width of 1 mm (i.e. at the area of the mask 14). It follows that the current should pass through a surface of approximately 0.1 mm×2 mm=0.2 mm². In the situation shown in FIG. 1 the surface area traversed by the beam equals approximately 0.025 mm² for a cross-section of the crossover amounting to 160 µm. Therefore, if the same current density as in FIG. 1 is to be permitted for the situation of FIG. 2, an increase of the overall beam current by the ratio to said surface areas will be permissible. This yields an increase of the beam current by a factor of eight. The permissible current in the beam, therefore, can increase by this factor, so that the throughput during the production of integrated circuits can also increase by a similar factor.

What is claimed is:

1. A lithography device for carrying out projection lithography by means of charged particles, which device includes an imaging particle-optical system for imaging a lithographic object structure (14) on a lithographic imaging surface (16), characterized in that the particle-optical system includes at least five quadrupoles (32, 34, 36, 38, 40), neighboring quadrupoles of said quadrupoles each time extending perpendicularly to one another, the strength and the location of said quadrupoles being such that the imaging of the lithographic object structure (14) on the lithographic imaging surface (16) is stigmatic, and that the system is telescopic in the x-z plane as well as in the y-z plane.

2. A lithography device as claimed in claim 1, in which the x magnification $M_x$ from the lithographic object structure to the lithographic imaging surface equals the y magnification $M_y$.

3. A lithography device as claimed in claim 2, in which the following four relations exist between the various dimensional parameters (A, a, b, c, d, D) of the particle-optical system:

$$A = \frac{-2DM^2(1+M) + b(1+4M+M^2-C)}{2(1+M)} \quad (1)$$

$$a = b\frac{-2M+C}{2(1+M)} \quad (2)$$

$$c = \frac{b}{M} \quad (3)$$

$$d = b\frac{-2M+C}{2M^2(1+M)} \quad (4)$$

in which:

M=the angular magnification by the imaging particle-optical system from the lithographic object structure (14) to the lithographic imaging surface (16), $C=\sqrt{(M+6M^2+M^3)}$, A=the distance between the lithographic object structure (14) and the first quadrupole (32), a=the distance between the first quadrupole (32) and the second quadrupole (34), b=the distance between the second quadrupole (34) and the third quadrupole (36), c=the distance between the third quadrupole (36) and the fourth quadrupole (38), d=the distance between the fourth quadrupole (38) and the fifth quadrupole (40), and D=the distance between the fifth quadrupole (40) and the lithographic imaging surface (16).

* * * * *